United States Patent
Kumazaki et al.

(10) Patent No.: US 7,573,306 B2
(45) Date of Patent: Aug. 11, 2009

(54) SEMICONDUCTOR MEMORY DEVICE, POWER SUPPLY DETECTOR AND SEMICONDUCTOR DEVICE

(75) Inventors: Noriyasu Kumazaki, Kawasaki (JP); Keiji Maruyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/668,159

(22) Filed: Jan. 29, 2007

(65) Prior Publication Data

US 2007/0176654 A1 Aug. 2, 2007

(30) Foreign Application Priority Data

Jan. 31, 2006 (JP) .................... P2006-023258

(51) Int. Cl.
*H03L 7/00* (2006.01)
(52) U.S. Cl. .................. 327/143; 327/77; 327/142; 327/198
(58) Field of Classification Search ............ 327/77, 327/142, 143, 198
See application file for complete search history.

(56) References Cited

U.S. PATENT DOCUMENTS

| | | | | | |
|---|---|---|---|---|---|
| 4,037,399 | A | * | 7/1977 | Chihara | 368/202 |
| 4,115,710 | A | * | 9/1978 | Lou | 327/536 |
| 4,217,535 | A | * | 8/1980 | Suzuki et al. | 323/317 |
| 4,272,840 | A | * | 6/1981 | Morozumi et al. | 368/202 |
| 4,683,386 | A | * | 7/1987 | Kamikawa | 327/308 |
| 4,716,323 | A | * | 12/1987 | Wada et al. | 327/50 |
| 4,812,889 | A | * | 3/1989 | Kakumu | 257/407 |
| 4,922,133 | A | * | 5/1990 | Iwahashi et al. | 327/77 |
| 5,208,488 | A | * | 5/1993 | Takiba et al. | 327/77 |
| 5,243,228 | A | * | 9/1993 | Maruyama et al. | 327/534 |
| 5,268,872 | A | * | 12/1993 | Fujii et al. | 365/189.07 |
| 5,301,161 | A | * | 4/1994 | Landgraf et al. | 365/185.04 |
| 5,440,255 | A | * | 8/1995 | Fournel | 327/81 |
| 5,617,044 | A | * | 4/1997 | Takamoto | 327/77 |
| 5,625,304 | A | * | 4/1997 | Azadet et al. | 327/63 |
| 5,629,642 | A | * | 5/1997 | Yoshimura | 327/142 |
| 5,723,990 | A | * | 3/1998 | Roohparvar | 327/81 |
| 5,736,877 | A | * | 4/1998 | Tihanyi | 327/77 |
| 5,767,710 | A | * | 6/1998 | Cho | 327/143 |
| 5,818,294 | A | * | 10/1998 | Ashmore, Jr. | 327/543 |
| 5,834,967 | A | * | 11/1998 | Kuroda et al. | 327/543 |
| 5,898,324 | A | * | 4/1999 | Yanagisawa | 327/81 |
| 6,049,200 | A | * | 4/2000 | Hayashimoto | 323/269 |
| 6,147,529 | A | * | 11/2000 | Yeh et al. | 327/143 |
| 6,157,563 | A | * | 12/2000 | Hirano et al. | 365/145 |
| 6,169,426 | B1 | * | 1/2001 | Lee et al. | 327/77 |
| 6,181,172 | B1 | * | 1/2001 | Callahan | 327/143 |

(Continued)

FOREIGN PATENT DOCUMENTS

JP 9-181586 7/1997

*Primary Examiner*—Lincoln Donovan
*Assistant Examiner*—Adam D Houston
(74) *Attorney, Agent, or Firm*—Oblon, Spivak, McClelland, Maier & Neustadt, P.C.

(57) ABSTRACT

A semiconductor memory device includes a n-channel type MOSFET in which a drain and a gate are connected to an external power supply and a source and a back gate are connected each other. A node is connected to the source and the back gate of the n-channel type MOSFET, and a detector for detecting an input of the external power supply based on a potential of the node.

12 Claims, 9 Drawing Sheets

U.S. PATENT DOCUMENTS

| | | | |
|---|---|---|---|
| 6,181,173 B1 * | 1/2001 | Homol et al. | 327/143 |
| 6,191,641 B1 * | 2/2001 | Devanney | 327/525 |
| 6,229,351 B1 * | 5/2001 | Wang | 327/77 |
| 6,310,497 B1 * | 10/2001 | Strauss | 327/143 |
| 6,351,163 B1 * | 2/2002 | Yoshizawa et al. | 327/142 |
| 6,353,337 B2 * | 3/2002 | Nasu et al. | 326/83 |
| 6,449,183 B1 * | 9/2002 | Hirano et al. | 365/145 |
| 6,480,428 B2 * | 11/2002 | Zheng et al. | 365/200 |
| 6,735,142 B1 * | 5/2004 | Oh | 365/227 |
| 6,791,373 B2 * | 9/2004 | Oyama | 327/78 |
| 6,847,240 B1 * | 1/2005 | Zhou | 327/143 |
| 6,972,550 B2 * | 12/2005 | Hong | 323/315 |
| 7,035,137 B2 * | 4/2006 | Iwata et al. | 365/158 |
| 2002/0000852 A1 * | 1/2002 | Nagaya | 327/143 |
| 2002/0005740 A1 * | 1/2002 | Kim | 327/143 |
| 2002/0075733 A1 * | 6/2002 | Zheng et al. | 365/200 |
| 2003/0067291 A1 * | 4/2003 | Hong | 323/315 |
| 2003/0189859 A1 * | 10/2003 | Takahashi et al. | 365/200 |
| 2005/0036362 A1 * | 2/2005 | Iwata et al. | 365/158 |
| 2005/0135175 A1 * | 6/2005 | Houston et al. | 365/229 |
| 2007/0176237 A1 * | 8/2007 | Yagishita et al. | 257/347 |
| 2007/0216564 A1 * | 9/2007 | Koseki | 341/155 |

* cited by examiner

PRIOR ART

SEMICONDUCTOR MEMORY DEVICE, POWER SUPPLY DETECTOR AND SEMICONDUCTOR DEVICE

CROSS REFERENCE TO RELATED APPLICATIONS

This application is based upon and claims the benefit of priority from the prior Japanese Patent Application No. 2006-023258 filed on Jan. 31, 2006: the entire contents of which are incorporated herein by reference.

BACKGROUND

1. Field of the Invention

This invention relates to a semiconductor memory device, a power supply detector and a semiconductor device each having a circuit for detecting an applying of an external power supply.

2. Description of the Related Art

Recently, with the widespread use of mobile instruments such as the portable telephone, it has been required to provide low power, low voltage operation and reliability at a wide temperature range. Under the circumstances, various problems which have not been considered conventionally have appeared. As one of the problems, there is an operation margin of a power supply input detection circuit (power-on circuit). The power input detecting circuit is for outputting a trigger signal to apply a voltage used in a semiconductor memory device by detecting that power from the outside is supplied.

In the semiconductor memory device used in mobile equipment and the like, MOSFETs (Metal-Oxide-Semiconductor Field Effect Transistor) which have a relatively high threshold (Vth) are adopted due to low power usage, wherein it is required to have a safety margin for low voltage operation and operational guarantee at a wide temperature range (for example, −40 to 100 degrees Celsius). Accordingly, it is required to have sufficient margins in the power supply input detection circuit of the power system.

In connection with these requirements, in a typical power supply input detection circuit using a diode-connected p-channel type MOSFET, the effect by the temperature dependant properties of a threshold of the p-channel type MOSFET is significant. Therefore, it is difficult to secure sufficient margin with respect to both a minimum power voltage value which can correctly latch a fuse data (fuse-latch limit voltage) and minimum power voltage value at which the semiconductor memory device can operate. That is, in a typical power supply input detection circuit, as the requirements of lower power, low voltage operation and wide temperature range operability become severe, since operational margins becomes insufficient, it is expected that the semiconductor memory device could not exhibit adequate performance.

As a known technique relating to the power supply input detection circuit, the use of a diode-connected n-channel MOS transistor having a gate and a drain connected (see, for example, Japanese Patent Laid-open Application Hei 9-181586, FIG. 2 and paragraph 0018). However, as described therein, when the structure in which the gate and the drain of the n-channel MOS transistor are connected is adopted, it is difficult to suitably perform the detection of power-on at a low power voltage and low temperature, because a threshold increases due to the back-bias effect.

SUMMARY

In view of the above circumstances, an object of the present invention is to provide a semiconductor memory device, a power supply detector and a semiconductor device which can reduce the variability based on temperature variation in the possible voltage range of the output of the power input detection circuit and secure enough margin in both a minimum power voltage which can exactly latch a fuse data and a minimum power voltage which can act in the semiconductor memory device.

To solve the above problems, a semiconductor memory device, a power supply detector and a semiconductor device comprise an n-channel type MOSFET in which a drain and a gate thereof are connected to an external power supply, a node connected to a source and a back gate of the n-channel type MOSFET, and a detector for detecting application of the external power supply based on a potential of the node.

DETAILED DESCRIPTION

Figure 1:
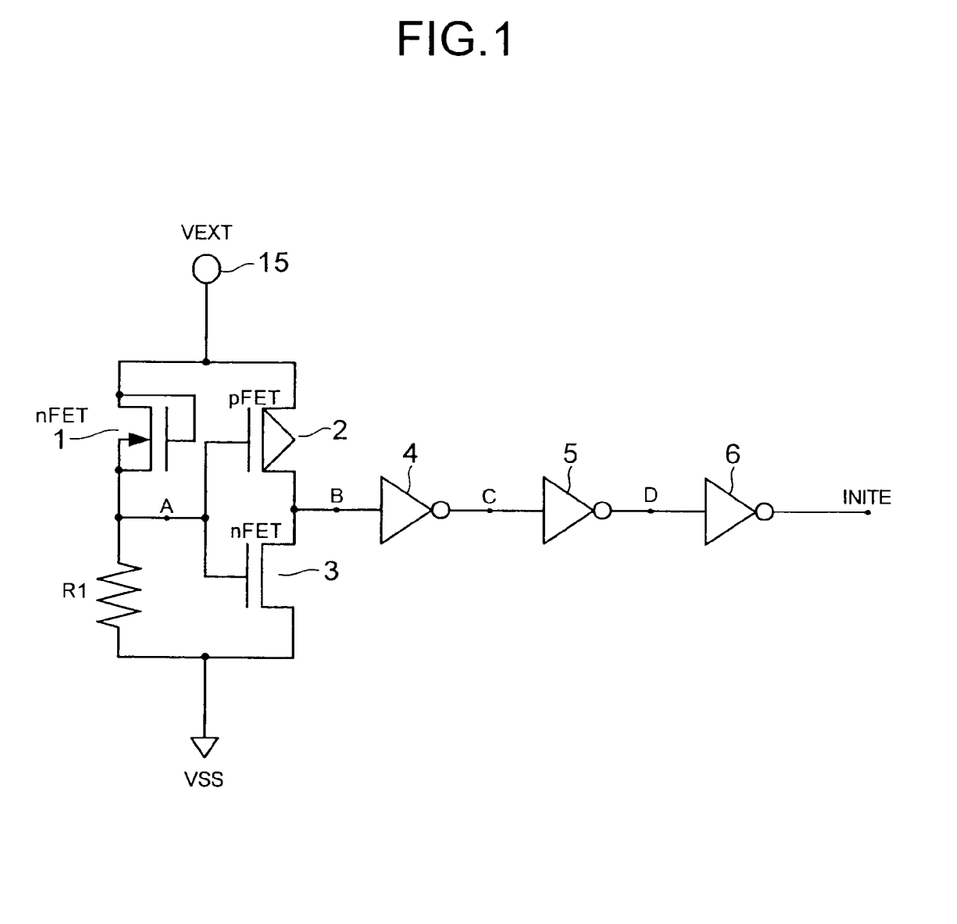
FIG. 1 is a drawing showing a structure of a power supply input detection circuit of a semiconductor memory device according to a first embodiment of the present invention.

The embodiments of the present invention will be described below. FIG. 1 is a drawing showing a structure of a power supply input detection circuit of the semiconductor memory device according to a first embodiment of the present invention. The power supply input detection circuit includes an n-channel type MOSFET 1, a p-channel type MOSFET 2, an n-channel type MOSFET 3, a resistance R1, and three inverters 4, 5 and 6. A drain of the n-channel type MOSFET 1 is connected to an input terminal 15 of an external power supply (VEXT). A gate of the n-channel type MOSFET 1 is connected to self-drain. That is, the drain and the gate of the n-channel type MOSFET 1 are connected together. A source (at node A) and a back gate of the n-channel type MOSFET 1 are connected together and the node A is grounded through the resistance R1. Further, the source of the n-channel type MOSFET 1 is connected to respective gates of the p-channel type MOSFET 2 and the n-channel type MOSFET 3 which are complementarily connected. The outputs (drains) of the complementarily connected p-channel type MOSFET 2 and n-channel type MOSFET 3 are connected to a first input terminal of a first inverter 4 among three inverters 4, 5, 6.

In this power supply input detection circuit, a potential at node A is in a level of VEXT−Vthn1 (Vthn1: threshold of the n-channel type MOSFET), and increases as a voltage of the external power supply (VEXT) increases. This increase of the potential of the node A is monitored in the p-channel type MOSFET 2 and the n-channel type MOSFET 2. When the potential of the node A become higher than the circuit threshold (in brief, the threshold of the n-channel type MOSFET 3) of the circuit constituted of these two MOSFETs, the n-channel type MOSFET 3 discharges a node B to a potential of the ground power source (VSS; logic "L"). Then the inverter 4 charges a node C to be a potential of the external power supply (VEXT; logic "H"), and the next inverter 5 discharges a node D to the potential of the ground power source (VSS; logic "L"). Further, the next inverter 6 charges an INITE node, which outputs an INITE signal that is a detection signal of the external power supply input, to become a potential of the external power supply (VEXT; logic "H"). By outputting this INITE signal, the above power-on sequence is started.

Figure 2:
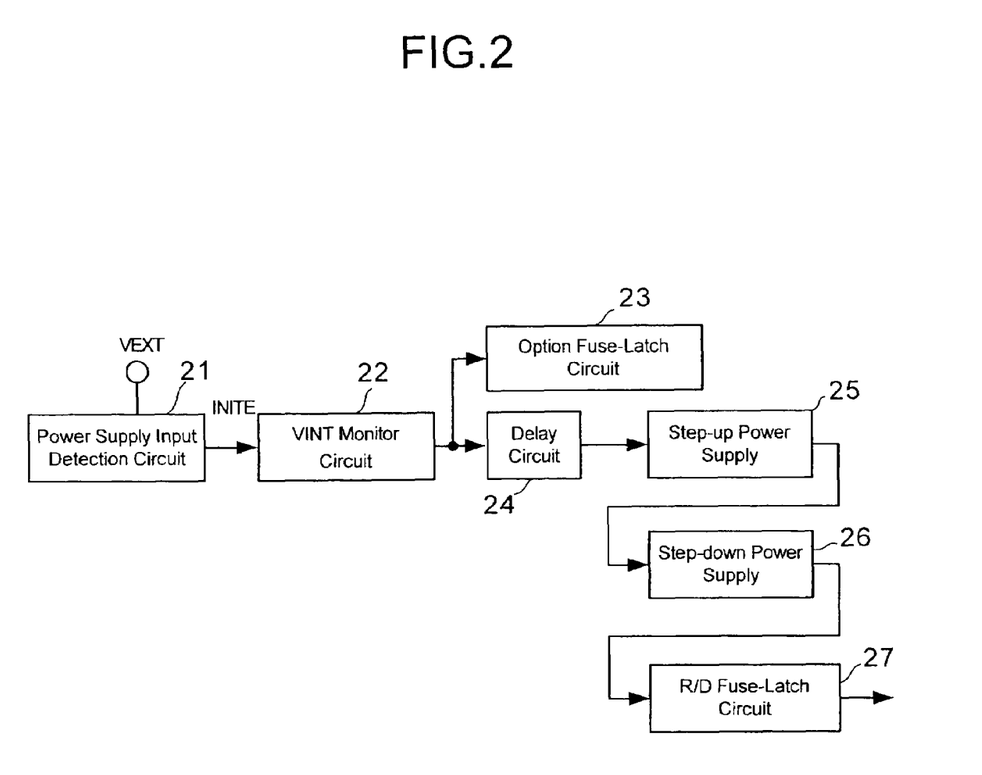
FIG. 2 is a block diagram for explaining a power-on sequence of the semiconductor memory device using the power supply input detection circuit shown in FIG. 1.

FIG. 2 is a block diagram for explaining the power-on sequence of the semiconductor memory device including the output of the power supply input detection circuit shown in FIG. 1 as a trigger.

When the external power supply (VEXT) is applied, the power supply input detection circuit 21 detects that the external power supply is applied based on a threshold, and outputs the INITE signal (logic "H"). By this INITE signal, the applying of the external power supply is detected within the semiconductor memory device, and the power-on operation of the internal power supply circuit is started.

A VINT monitor circuit 22 receives the INITE signal, and monitors the start of applying a reference potential which forms a base of the internal power supply (VINT) of the semiconductor memory device and all internal potential. The VINT monitor circuit 22 detects that levels of the internal power supply (VINT) and reference potential have reached respective setting levels, then outputs the detection signals to an option fuse-latch circuit 23 and a delay circuit 24.

When the option fuse-latch circuit 23 receives the detection signal, for example, the option fuse-latch circuit 23 latches fuse data for trimming a DC level and the like. As above, in the option fuse-latch circuit 23, by obtaining the fuse data of a DC system such as the DC level in an early step and, thus, determining the data, it is possible to suppress the change of potential after the completion of the power-on operation. Further, the data that the option fuse-latch circuit 23 latches is not limited to the DC system fuse data and other data may be allowable.

On the other hand, the delay circuit 24 delays for a predetermined time and outputs the output of the VINT monitor circuit 22 to a step-up power supply circuit 25 (boost converter) as a trigger signal. The step-up power supply circuit 25 receives the trigger signal and starts generating a drive system potential (Vpp) of a word line. When the drive system potential (Vpp) of the word line reaches a predetermined level, a step-down power supply circuit 26 starts a generating-operation of a cell substrate system potential (Vbb). When the power supply voltage of the cell substrate system reaches the setting level, an R/D fuse-latch circuit 27 latches redundant fuse data, and initializes an internal node based on the latched data. Thereby, the power-on operation of the semiconductor memory device is completed.

Here, the drive system potential Vpp of the word line and the potential Vbb of the cell substrate are described for simplifying the explanation of the power-on sequence. The explanation of other internal potentials are omitted.

As the semiconductor memory device used in the mobile instrument, a MOSFET having a relatively high threshold (Vth) due to a lower power is employed. Further, it is required to have a margin of the lowest voltage (Vccmin) which guarantees operability of the semiconductor memory device and a wide range of temperature reliability (for example, −40 to 100 degree Celsius guarantee temperature). Accompanying these requirements, it becomes necessary to have enough margin in the power supply input detection circuit of the power supply system. Next, we will describe the reason therefor.

(The Typical Power Supply Input Detection Circuit.)

Figure 9:
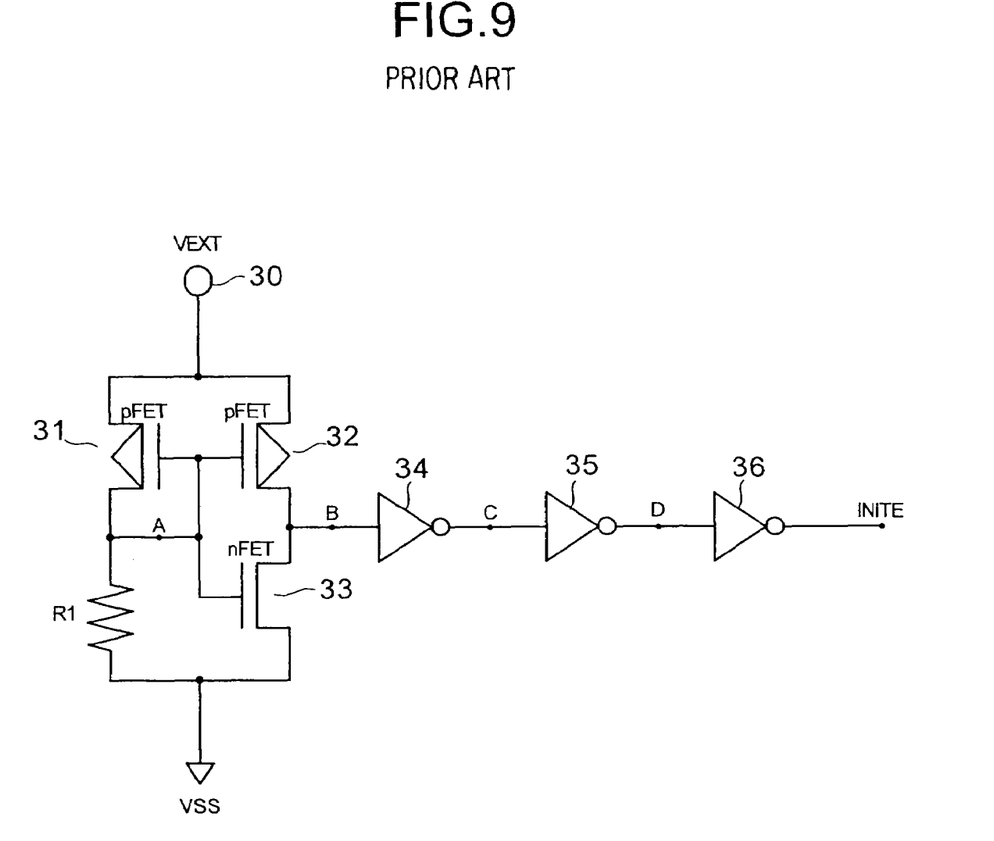
FIG. 9 is a drawing showing a structure of a conventional or typical power supply input detection circuit in comparison with the present invention.

FIG. 9 shows a structure of a typical power supply input detection circuit for detecting an external power supply input to a semiconductor memory device. In the typical power supply input detection circuit, a diode-connected p-channel type MOSFET 31 is used. That is, in the typical power supply input detection circuit, by the diode-connected p-channel type MOSFET 31, a threshold of the p-channel type MOSFET is monitored, and, by a n-channel type MOSFET 33, a threshold of the n-channel type MOSFET is monitored. When a voltage of the external power supply (VEXT) is higher than the sum (Vthn+Vthp) of the threshold of the n-channel type MOSFET and the threshold of the p-channel type MOSFET, an INITE signal is output from the power supply input detection circuit. Further, in other words, in this typical power supply input detection circuit, a power-on sequence is started by detecting that an external power supply voltage has risen to a level at which the external power supply voltage can operate all elements within the semiconductor memory device.

This typical power supply input detection circuit has no problems when used in a semiconductor memory device in which the external power supply voltage is relatively high and the temperature reliability range is not so wide. However, in order to guarantee an operation at a low power, a MOSFET having a high threshold is used, and when a low voltage operation and/or wide temperature reliability range are required, many problems occur.

Figure 10:
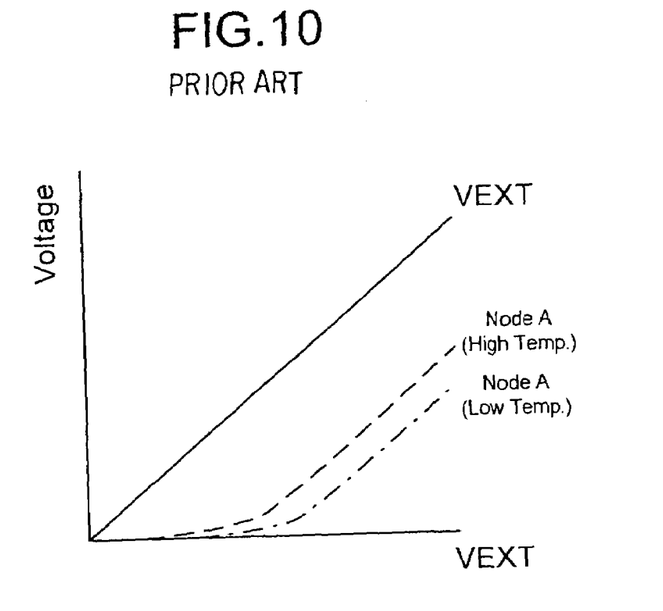
FIG. 10 is a drawing showing temperature dependency of a node A in the typical power supply input detection circuit shown in FIG. 9.
Figure 11:
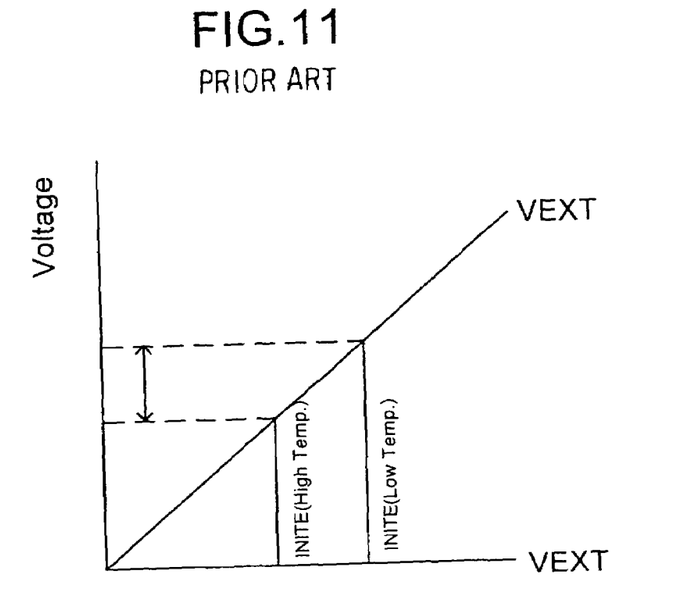
FIG. 11 is a drawing showing temperature dependency of the output of the typical power supply input detection circuit shown in FIG. 9.

In the typical power supply input detection circuit shown in FIG. 9, the temperature property when an external power supply (VEXT) is applied, a potential of a node A becomes VEXT−Vthp (Vthp: a threshold of p-channel type MOSFET 31) and rises up, is shown in FIG. 10. Since the threshold of MOSFETs exhibits minus a temperature dependency in both the n-channel type MOSFET and the p-channel type MOSFET, the temperature dependency thereof is high at a low temperature and is low at a high temperature. Therefore, the rise of the potential of the node A is fast when the temperature is high. Since the later circuits are operated based on the node A having a temperature dependency, later circuits have similar temperature dependency. That is, as shown in FIG. 11, at a high temperature, the power supply input detection circuit operates and outputs the INITE signal during a low voltage of the external power supply (VEXT).

Such dispersion of output potential of the INITE signal brings serious problems, because as the minimum voltage value (Vccmin) which guarantees the operation of the semiconductor memory device becomes lower, a permissible margin of the dispersion of output potential is lost. Further, the effect on the latch action of the fuse data by the option fuse-latch circuit 23 becomes a serious problem.

Figure 12:
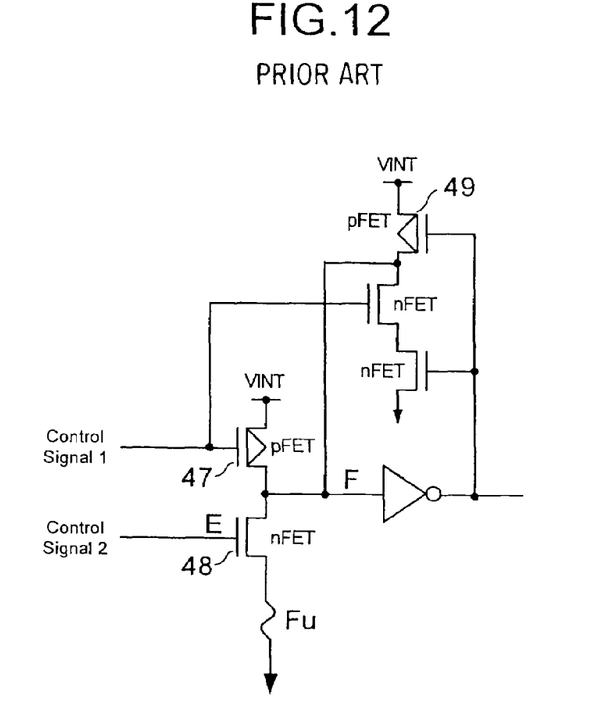
FIG. 12 is a drawing showing a structure of the option fuse latch circuit shown in FIG. 2.

FIG. 12 is a drawing showing a structure of the option fuse-latch circuit 23 shown in FIG. 2. At an initial state, both a control signal 1 (VINT system signal) and a control signal 2 (VINT system signal) have a logic level "L" (VSS). A node F is pre-charged to a VINT level with a p-channel type MOSFET 47 and p-channel type MOSFET 49. When a logic level of the control signal 1 is "H" (VINT), the p-channel type MOSFET 47 turns to cut-off. Next, the logic level of the control signal 2 turns to "H", thereby n-channel type MOSFET 48 turns on. Here, if a fuse element Fu is cut, since a path which discharge a charge of the node F to a ground power supply (VSS) through a n-channel type MOSFET 48 does not exist, the node F holds a logic level "H". If the fuse element is not cut, since the charge of the node F is discharged to ground power supply (VSS) through the n-channel type MOSFET 48, a logic level of the node F turns to "L", thereby the fuse data being latched.

That is, in this option fuse-latch circuit 23, an action which latches fuse data becomes a ratio action in which the latch data are determined depending on the action which has stronger behavior between a discharging action of n-channel type MOSFET 48 and a charging action of p-channel type MOSFET 49. Owing to this, when a level of the control signal 2, an internal power supply (VINT) or the like is low, even if a fuse element is not cut, since a charge of the node F does not discharge efficiently into ground power supply (VSS) through the n-channel type MOSFET 48 (the charge with a p-channel type MOSFET 49 is superior) the logic level of the node F remains "H". Consequently, it occurs that the correct latch of fuse data is impossible.

Figure 13:
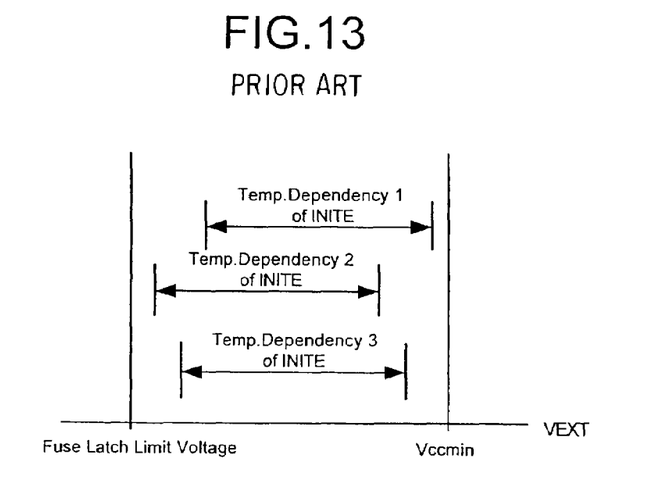
FIG. 13 is a drawing showing a setting range of the output in the typical power supply input detection circuit shown in FIG. 9.

For normally latching fuse data, it is required that a size ratio of n/p channel type MOSFETs, a level of the internal power supply (VINT), and the like are optimum. Further, to increase the operability margin of the semiconductor memory device at low voltage operation, it is necessary to power-on a power supply system with a voltage lower than the minimum voltage reliability required in operation. These relations are shown in FIG. 13. In the temperature property 1 of the INITE signal shown in FIG. 13, the possible range of the INITE signal is shifted to a high voltage level so as to supply sufficient margins to the minimum power supply voltage value (fuse-latch limit voltage) which can correctly latch fuse data. However, in this, the margin of low voltage operation is insufficient. And in the temperature property 2 of the INITE signal, the range of the INITE signal is shifted to a low voltage level to improve the margin at low voltage operation. In this case, the margin is insufficient of the fuse-latch limit voltage. Accordingly, considering the fluctuation of PVT dispersion of the INITE signal, ideally, it is desirable to have margins for both the fuse-latch limit voltage and the low voltage operation as the temperature property 3 of the INITE signal. However, in the typical power supply input detection circuit using a diode-connected p-channel type MOSFET, the effect of temperature dependency of threshold of the p-channel type MOSFET is large, thus it is difficult to have enough margin to both fuse-latch limit voltage and low voltage operation. That is, in the typical power supply input detection circuit, as the requirements for low power, low voltage operation and wide temperature operability range becomes severe, an operation margin becomes insufficient, hence it is expected to be difficult to exhibit adequate performance as a semiconductor memory device.

(A Power Supply Input Detection Circuit of the Present Invention)

Figure 3:
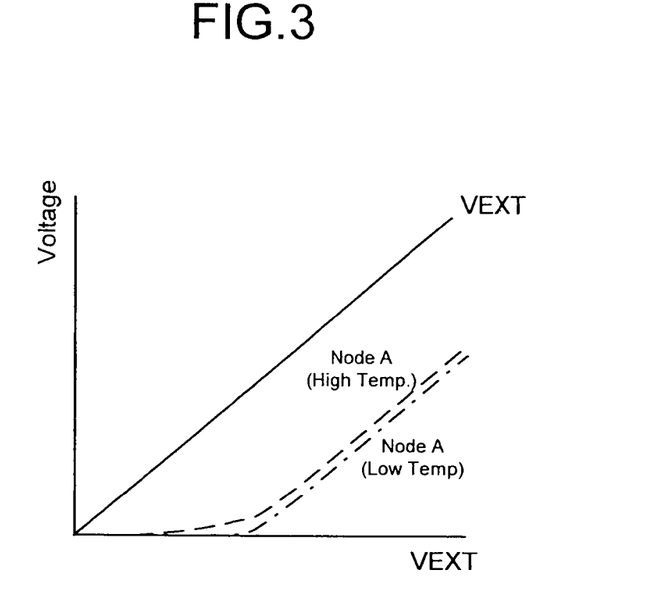
FIG. 3 is a drawing showing temperature dependency of a node A of the power supply input detection circuit shown in FIG. 1.
Figure 4:
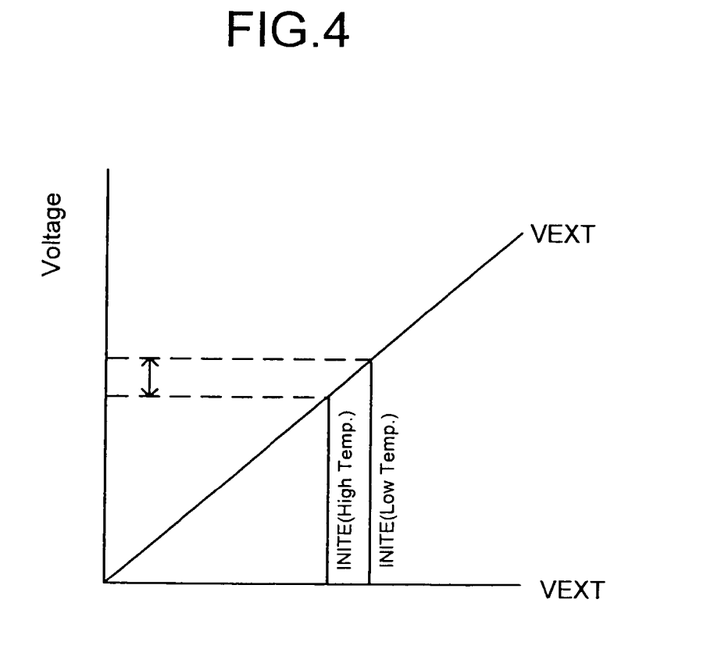
FIG. 4 is a drawing showing temperature dependency of an output of the power supply input detection circuit shown in FIG. 1.

Main differences between a power supply input detection circuit of the present invention shown in FIG. 1 and a typical power supply input detection circuit shown in FIG. 9 areas follows. In the present invention, instead of a diode-connected p-channel type MOSFET 31, an n-channel type MOSFET 1 is used in which the drain is connected to the gate, and the source is connected to the back gate. Generally, the temperature dependency of threshold of the n-channel type MOSFET is smaller than that of the p-channel type MOSFET. Therefore, as shown in FIG. 3, the temperature dependency of the potential of the node A which rises at the level of the VEXT−Vthn1 (Vthn1: the threshold of the n-channel type MOSFET 1) decreases. As a result, as shown in FIG. 4, the temperature dependency of the INITE signal which is output from the power supply input detection circuit decreases.

Figure 5:
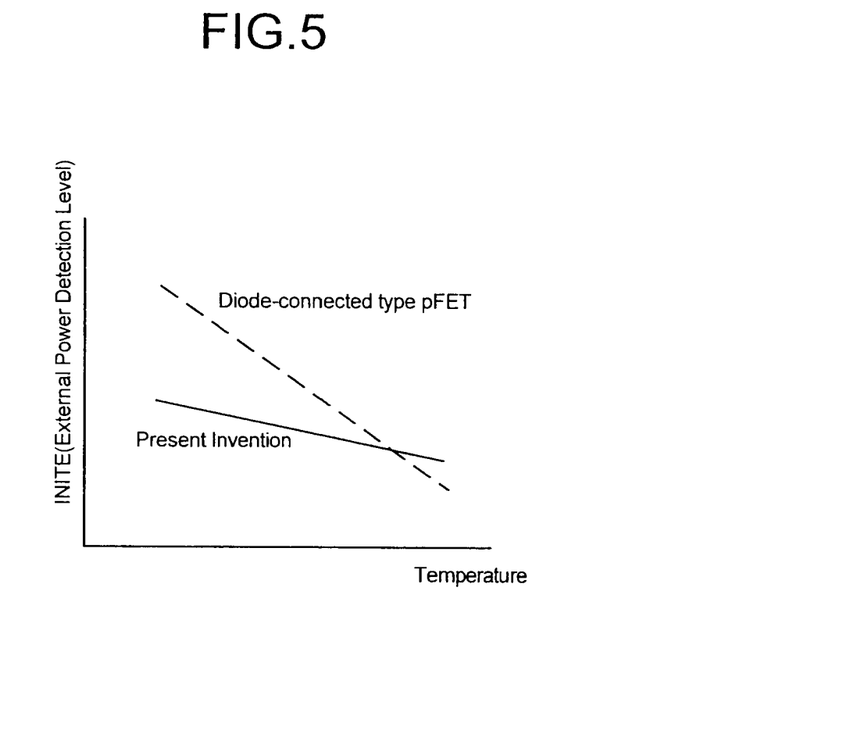
FIG. 5 is a drawing showing a comparison of the temperature dependency of output between the power supply input detection circuit shown in FIG. 1 and a power supply input detection circuit shown in FIG. 9.
Figure 6:
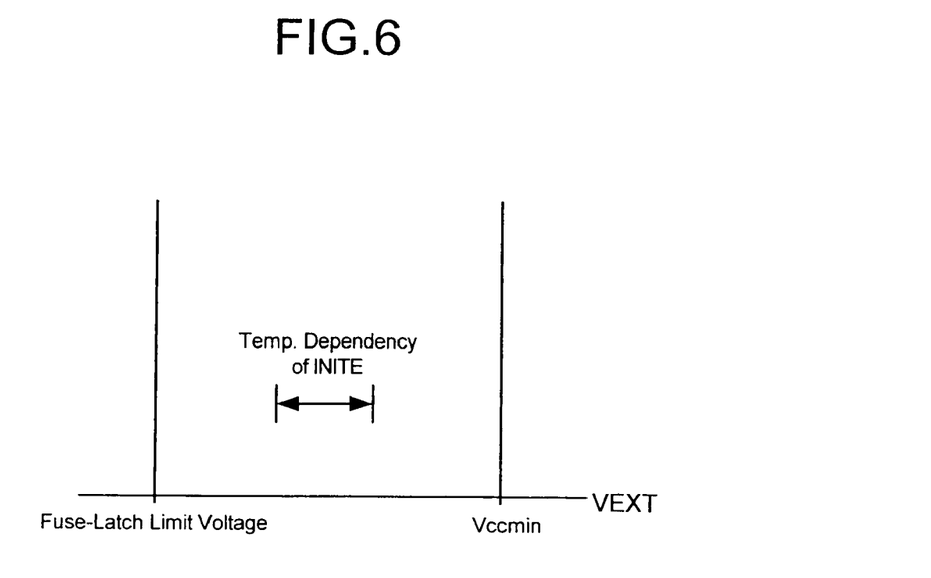
FIG. 6 is a drawing showing a setting range of the output of the power supply input detection circuit shown in FIG. 1.

Thus, by using the n-channel type MOSFET 1 in which the drain is connected to the gate and the source is connected to the back gate, as shown in FIG. 5, it is possible to suppress the rate of fluctuation of level of the INITE signal in the power supply input detection circuit based on temperature, compared with a power supply input detection circuit using a diode-connected p-channel type MOSFET. Therefore, it is easy to set a power-on voltage (voltage at the time that the INITE signal is output from the power supply input detection circuit). That is, as shown in FIG. 6, it is possible to take a large margin for the fuse-latch limit voltage and for the low voltage operation of the semiconductor memory device, because the fluctuation of the INITE signal based on the PVT dispersion can be suppressed.

Further, as the known power supply input detection circuit disclosed in Japanese Patent Laid-open Application No. Hei 9-181586, simply connecting the drain and the gate of the n-channel type MOSFET creates difficulties in suitably making a power-on detection at the time of low power supply voltage/low temperature, due to the influence of the effect of back bias. In contrast, in the embodiment of the present invention, by connecting the source and the back gate together, the above problem is eliminated, because the threshold of an n-channel MOSFET itself can be accurately monitored.

Figure 7:
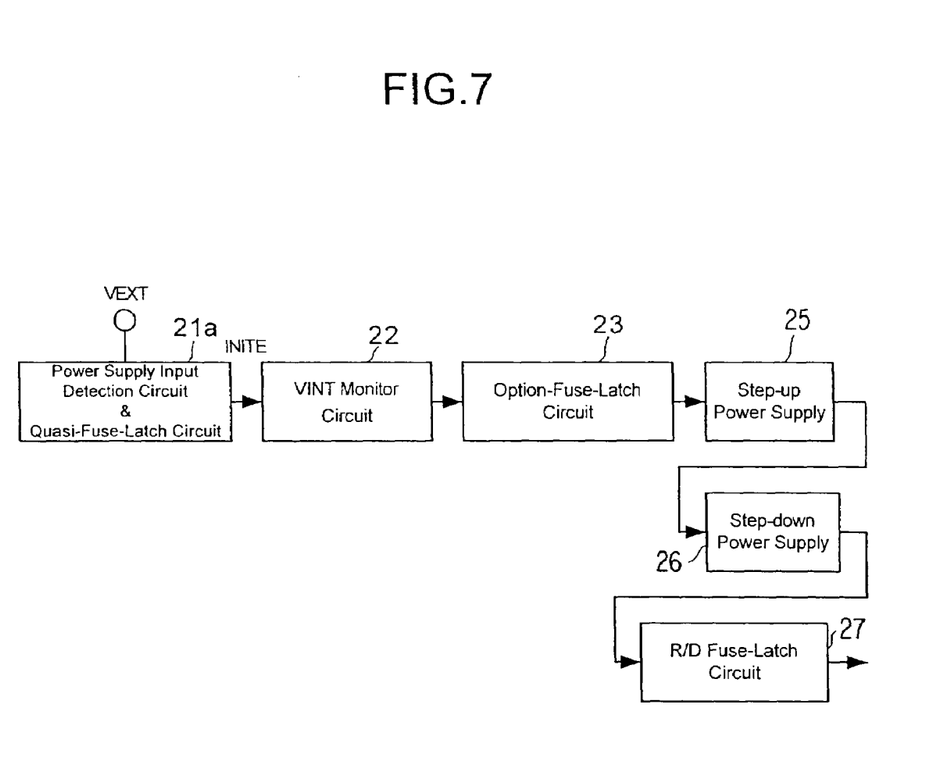
FIG. 7 is a block diagram for explaining the power-on sequence using a power supply input detection circuit according to a second embodiment.

Next, we will describe a second embodiment of the present invention. The feature of the second embodiment is that as shown in FIG. 7, in order to exactly latch a fuse information, a quasi-fuse-latch circuit which is an external voltage threshold detector for monitoring whether the external power supply voltage rises to a voltage capable of latching the fuse information, is incorporated into a power supply input detection circuit 21a. Here, the power supply input detection circuit 21a uses both the n-channel type MOSFET in which the drain is connected with the gate and the source is connected with the back gate, and the diode-connected p-channel type MOSFET.

Figure 8:
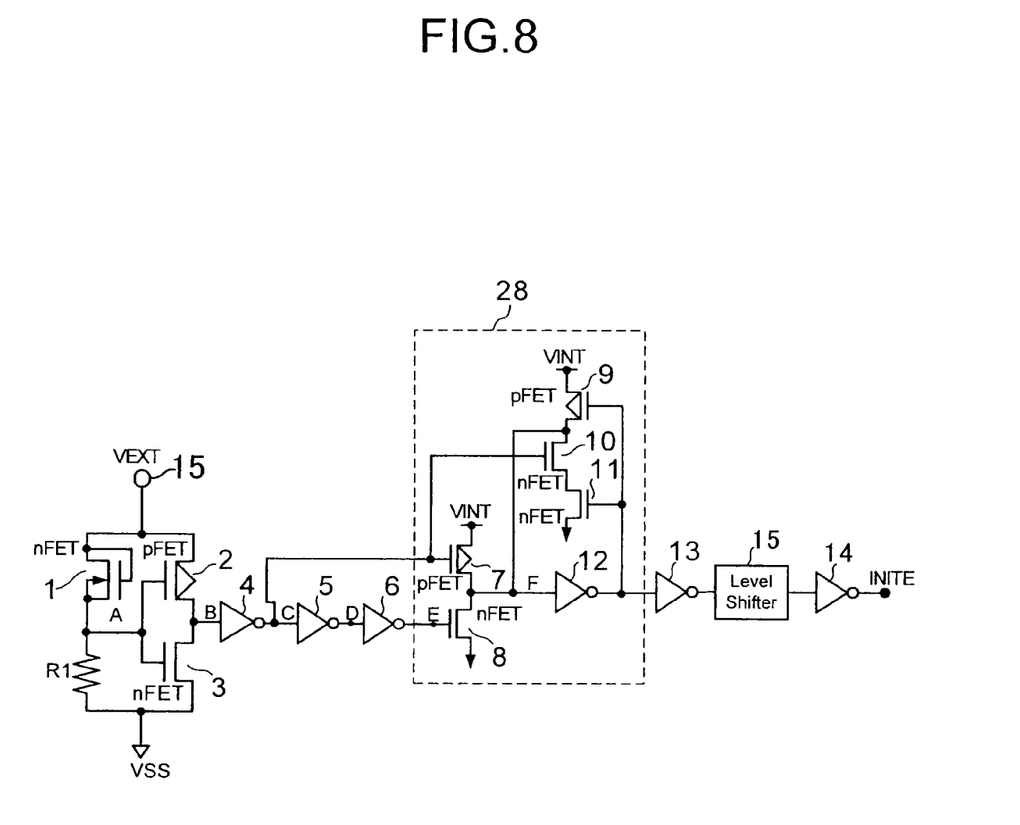
FIG. 8 is a drawing showing a structure of the power supply input detection circuit shown in FIG. 7.

FIG. 8 is a drawing showing a structure of the power supply input detection circuit 21a using the n-channel type MOSFET 1 in which the drain is connected with the gate and the source is connected with the back gate, and a quasi-fuse-latch circuit 28. As shown in FIG. 8, the quasi-fuse-latch circuit 28 has substantially the same circuit constant as the typical option fuse-latch circuit 23 shown in FIG. 12. That is, the quasi-fuse-latch circuit 28 has a p-channel type MOSFET 7 and an n-channel type MOSFET 10 for pre-charging which receives an output of the inverter 4 (the node C) at a gate, and an n-channel type MOSFET 8 for a fuse set which receive an output of the inverter 6 (the node E) at a gate.

Respective sources of the p-channel type MOSFET 7 and the n-cannel type MOSFET 10 for pre-charging are connected to an internal power supply (VINT). The drain of the p-channel type MOSFET 7 and the drain of the n-channel type MOSFET 8 are connected to the latch node F. The latch node F is connected to an input terminal of an inverter 12. An output terminal of the inverter 12 is connected to respective gates of the p-channel type MOSFET 9 and the n-channel type MOSFET 11. And the output terminal of the inverter 12 is connected to an input terminal of an inverter 13. An output terminal of the inverter 13 is connected to an input terminal of a level shifter 15 which is a conversion circuit from the VINT power supply to the VEXT power supply. An output terminal of the level shifter 15 is connected to an input terminal of an inverter 14, and the INITE signal is output from the output terminal of the inverter 14.

Since quasi-fuse-latch circuit 28 is incorporated into the power supply input detection circuit 21a, it is possible to minimize (minimum value which can fuse-latch) the power-on voltage of the semiconductor memory device.

Next, we will describe an operation of the power supply input detection circuit 21a using the n-channel type MOSFET 1 in which the drain is connected with the gate and the source is connected with the back gate, and the quasi-fuse-latch circuit 28 which is the external voltage threshold detector.

A level of the node A is VEXT−Vthn1 (Vthn1: the threshold of the n-channel type MOSFET 1), and the level rises with the increase of voltage of the external power supply (VEXT). In this embodiment, the n-channel type MOSFET 1 in which the drain is connected with the gate and the source is connected with the back gate is used. Accordingly, the ratio of variation to the temperature of the node A is about ½ to ⅓ compared with that of a diode-connected p-channel type MOSFET.

The level increase of the node A is monitored at the p-channel type MOSFET 2 and the n-channel type MOSFET 3. If the level of the node A rises more than the circuit threshold of the circuit (in brief, the threshold of n-channel type MOSFET 3) constituted by these two MOSFETs, the p-channel type MOSFET 2 cuts off and the n-channel type MOSFET 3 discharges the node B, so as to reduce the level to the level of the ground power supply (VSS; logic "L"). Then the inverter 4 charges the node C and brings the level to the level of the external power supply (VEXT; logic "H"), and the next step inverter 5 discharges the node D so as to reduce the level to the level of the ground power supply (VSS; logic "L"). Further the next step inverter 6 charges the node E to be the level of the external power supply (VEXT; logic "H").

At an initial state, since the logic levels of the node C and the node E are both the logic "L", the latch node F is pre-charged to a potential of the internal power supply (VINT) by the p-channel type MOSFET 7 and the p-channel type MOSFET 9. When the logic level of the node C becomes "H", the p-channel type MOSFET 7 becomes cut-off. Subsequently, the logic level of the node E becomes "H", thereby a n-channel type MOSFET 8 turns on. Then, the discharge of the latch node F by the n-channel type MOSFET 8 and the charge of the latch node F (fuse-latch operation) by the p-channel type MOSFET 9 are simultaneously performed. At this time, the potential of the latch node F rises. If the capacity of discharge of the n-channel type MOSFET 8 exceeds the capacity of charge of the p-channel type MOSFET 9, the latch is reversed, and the latch node F is discharged to the logic level "L" of the ground power supply (VSS). As the result, an INITE signal is output from the power supply detection circuit 21a through the inverters 12, 13, and 14.

Here, the quasi-fuse-latch circuit 28 has substantially an equal circuit constant as an actual fuse latch circuit (for example, option fuse-latch circuit 23, R/D fuse-latch circuit 27 and the like) within the semiconductor memory device. Therefore, in the quasi-fuse-latch circuit 28, when the latch of fuse data is normally conducted, the power-on sequence proceeds and it is guaranteed that actual fuse data (for example, product fuse information, redundancy information) within the semiconductor memory device can be exactly read.

Further, the circuit constant of the quasi-fuse-latch circuit 28 may be set to a much larger value than that of the actual fuse-latch circuit to secure a value larger than the margin of the minimum power supply voltage value.

As mentioned above, by incorporating the quasi-fuse-latch circuit 28 into the power supply input detection circuit 21a, even if the output range of the INITE signal is extended in order to obtain a low voltage operation margin of the semiconductor memory device, unless the sequence of the quasi-fuse-latch circuit 28 proceeds, the power-on sequence of the power system does not proceed. So that the latch error of the fuse information in the later fuse latch circuit (for example, option fuse-latch circuit 23, R/D fuse-latch circuit 27, and the like) can be suppressed.

Here, the quasi-fuse-latch circuit 28, which is an external voltage threshold detector, is not limited to an imitation fuse-latch circuit, but the other imitated circuit for determining a power on voltage may be allowable.

As described above, according to the embodiments of the present invention, by using the n-channel type MOSFET 1 in which the drain is connected with the gate and the source is connected with the back gate, it becomes possible to decrease the temperature dependency of the INITE signal, and, by using the quasi-fuse-latch circuit 28, it becomes possible to obtain the maximum margin as a margin of minimum voltage value which guarantees the operation of the semiconductor memory device. Therefore, the operation margin for the low power/low voltage operation/reliability at wide temperature can be secured.

According to the semiconductor memory device of the present invention, by decreasing the fluctuation dependant on the temperature in the range of voltage in which the power supply input detection circuit can be employed, it is possible to secure enough margin to both the minimum power supply voltage that can exactly latch fuse data and the minimum power supply voltage that can operate the semiconductor memory device.

Further, the semiconductor memory device of the present invention is not limited to the above embodiments, but includes any modifications which come within the scope which does not depart from that of gist of the invention.

What is claimed is:

1. A semiconductor memory device, comprising:
    a first n-channel type MOSFET in which a drain and a gate thereof are connected to an external power supply, and a source and a back gate thereof are connected to each other;
    a node which is connected to the source and the back gate of the n-channel type MOSFET;
    a monitoring device for monitoring a potential of the node to detect an applying of the external power supply; and
    an internal voltage monitor which monitors an output from the monitoring device to generate an internal voltage detection signal, the internal voltage detection signal being generated by detecting that a voltage of the external power supply reaches a predetermined value.

2. The semiconductor memory device according to claim 1, wherein the monitoring device comprises a second n-channel type MOSFET and a p-channel type MOSFET which are connected complementarily to each other.

3. The semiconductor memory device according to claim 1, further comprising:
an internal power generator which outputs an internal power supply based on the internal voltage detection signal; and
a fuse-latch circuit which latches fuse data by use of the internal power supply.

4. The semiconductor memory device according to claim 3, wherein the predetermined value of the internal voltage monitor is a voltage value of which the fuse-latch circuit can latch the fuse data in the fuse-latch circuit.

5. The semiconductor memory device according to claim 1, wherein the monitoring device comprises an inverter which reverses an output of the monitoring device.

6. A semiconductor device which has a power detector, comprising:
a first n-channel type MOSFET in which a drain and a gate thereof are connected to an external power supply, and a source and a back gate thereof are connected to each other;
a second n-channel type MOSFET and a first p-channel type MOSFET which are connected complementarily to each other, each of the second n-channel type MOSFET and the first p-channel type MOSFET having a gate connected to the source and the back gate of the first n-channel type MOSFET and a drain outputting a detection output which detects an applying of the external power supply; and
an internal voltage monitor for monitoring the detection output to generate an internal voltage detecting signal, the internal voltage detecting signal being generated by detecting that a voltage of the external power supply reaches a predetermined value.

7. The semiconductor device according to claim 6, further comprising:
an internal power generator for outputting an internal power supply to be used within the semiconductor device based on the internal voltage detection signal; and
a fuse-latch circuit for latching fuse data by use of the internal power supply.

8. The semiconductor device according to claim 7, wherein the predetermined value of the internal voltage monitor is a voltage of which the fuse-latch circuit can latch the fuse-latch data.

9. The semiconductor device according to claim 7, wherein the power detector further comprises an inverter which reverses the detection output.

10. The semiconductor device according to claim 9, wherein the inverter comprises a plurality of inverters of which uneven numbers of inverters are series connected.

11. The semiconductor device according to claim 9, wherein the inverter comprises:
a first inverter which reverses the detection output;
a second inverter which reverses an output of the first inverter; and
a third converter which reverses an output of the second inverter.

12. The semiconductor device according to claim 11, wherein the power detector further comprises a third n-channel type MOSFET and a second p-channel type MOSFET which are complementarily connected to each other; and
wherein the output of the first inverter is connected to a gate of the second p-channel type MOSFET, an output of the third inverter is connected to a gate of the third n-channel type MOSFET, and respective drains of the third n-channel type MOSFET and the second p-channel type MOSFET are connected to each other to output a quasi-fuse data.

* * * * *